(12) United States Patent
Asa et al.

(10) Patent No.: US 7,138,850 B1
(45) Date of Patent: Nov. 21, 2006

(54) HIGH-GAIN SYNCHRONIZER CIRCUITRY AND METHODS

(75) Inventors: Gil Asa, Zikhron Ya'akov (IL); David Moshe, D.N. Gilboa (IL)

(73) Assignee: Marvell Semiconductor Israel Ltd (IL)

( * ) Notice: Subject to any disclaimer, the term of this patent is extended or adjusted under 35 U.S.C. 154(b) by 0 days.

(21) Appl. No.: 10/911,454

(22) Filed: Aug. 3, 2004

Related U.S. Application Data

(60) Provisional application No. 60/541,672, filed on Feb. 4, 2004.

(51) Int. Cl.
  *G06G 7/12* (2006.01)
(52) U.S. Cl. .................. 327/363; 327/565; 327/155
(58) Field of Classification Search .............. None
  See application file for complete search history.

(56) References Cited

U.S. PATENT DOCUMENTS

| | | | |
|---|---|---|---|
| 4,617,480 A | 10/1986 | Au ..................... | 307/480 |
| 4,800,300 A | 1/1989 | Walters, Jr. ............. | 307/279 |
| 5,034,967 A | 7/1991 | Cox et al. .............. | 375/119 |
| 5,467,038 A * | 11/1995 | Motley et al. ........... | 327/185 |
| 5,594,392 A * | 1/1997 | Kondoh et al. .......... | 331/57 |
| 5,861,780 A * | 1/1999 | Fukuda ................ | 331/57 |
| 6,349,122 B1 | 2/2002 | Woodman ............. | 375/373 |
| 6,831,494 B1 * | 12/2004 | Fu et al. ............... | 327/199 |
| 6,975,151 B1 * | 12/2005 | Akiyoshi .............. | 327/199 |
| 2005/0088235 A1 * | 4/2005 | Drottar ................ | 330/277 |
| 2005/0105357 A1 * | 5/2005 | Oh .................... | 365/222 |

* cited by examiner

*Primary Examiner*—Timothy P. Callahan
*Assistant Examiner*—Cassandra Cox

(57) ABSTRACT

High-gain synchronizer circuitry and methods are provided that reduce the meta-stable resolve time of a synchronizer circuit. The high-gain synchronizer is made up of high-gain latch circuits. The high-gain latch circuits are made up of a series of inverters that at least initially increase in size and that are connected in a closed loop. In accordance with the invention, the time that the high-gain synchronizer remains in the meta-stable state is minimized through the use of the high-gain latch circuits.

99 Claims, 4 Drawing Sheets

HIGH-GAIN SYNCHRONIZER CIRCUITRY AND METHODS

This application claims the benefit of provisional application 60/541,672 filed Feb. 4, 2004, which is hereby incorporated by reference herein in its entirety.

BACKGROUND OF THE INVENTION

This invention relates to circuitry and methods for a high-gain synchronizer. A synchronizer is used to receive an input signal, which may be asynchronous, and to output that signal as a synchronous output. A synchronizer may be used, for example, to receive an asynchronous signal at the input to a synchronous system or it may provide synchronization between two or more asynchronous circuits.

In a synchronous circuit the key components are at least partly controlled by one or more reference clocks. The state of the circuit only changes (at least in major respects) in relation to a reference clock. For example, reference clock may determine when inputs are sampled and when outputs can change. When asynchronous signals are input to synchronous circuits, synchronizers are used to "synchronize" the asynchronous signal to the reference clock.

When an asynchronous signal is sampled by a synchronizer, if the asynchronous signal is out of the sampling window or unresolved, the synchronizer will not be able to determine whether the asynchronous input signal is HIGH or LOW. Thus, the synchronizer may enter a meta-stable state, i.e., an unstable logic state that is neither HIGH nor LOW.

Typically, the synchronizer will automatically resolve itself into a stable state (i.e., HIGH or LOW) after a potentially long period of time in the meta-stable state. However, if the synchronizer does not leave the meta-stable state and settle into a stable state before the next clock triggered transition, a system failure may result from the meta-stable signal being output by the synchronizer and propagated throughout the system. It would therefore be desirable to provide circuitry and methods for a high-gain synchronizer that minimizes the meta-stable resolve time of the synchronizer.

A latch circuit is a circuit that can sample (i.e., receive) an input signal and can maintain and output the HIGH or LOW value of the input signal. A few latches, when connected together with other logic gates, can be used to create a synchronizer.

One typical synchronizer architecture uses a series of two latch circuits connected in a master-slave configuration. In a typical master-slave synchronizer, the first latch circuit (i.e., "the master") samples the asynchronous input signal at a first clock triggered time and the second latch circuit (i.e., the slave) receives the signal from the first latch circuit and outputs a synchronous output at the next clock triggered time.

If the first latch does not resolve the sampled input signal into a stable state within the reference clock triggered time period, a meta-stable signal will be transferred through to the synchronous output of this synchronizer. It would therefore be desirable to provide circuitry and methods for a high-gain latch circuit that has a greater probability of resolving a meta-stable signal into a stable state before its output is transferred into the logic circuit by the reference clock signal.

SUMMARY OF THE INVENTION

In accordance with the invention, a high-gain synchronizer is provided that minimizes the meta-stable resolve time. This high-gain synchronizer is made up of a series of high-gain latch circuits. The high-gain latch circuits are made up of a series of inverters of increasing size connected in a closed loop configuration. A small inverter receives the input signal because small inverters are quickly and easily driven, even by small logic gates. Large inverters in the latch circuit provide a loop gain that ideally forces the latch out of the meta-stable state. The other inverters range in size between the small and large inverters in the latch circuit loop and allow the high-gain latch to operate as quickly as possible by eliminating large increases in size between the inverters (i.e., one or more medium sized inverters are placed between the small and large inverters to transition between the small inverter output and the large inverter input).

Further features of the invention, its nature and various advantages, will be more apparent from the accompanying drawings and the following detailed description of the preferred embodiments.

DETAILED DESCRIPTION

Figure 1:
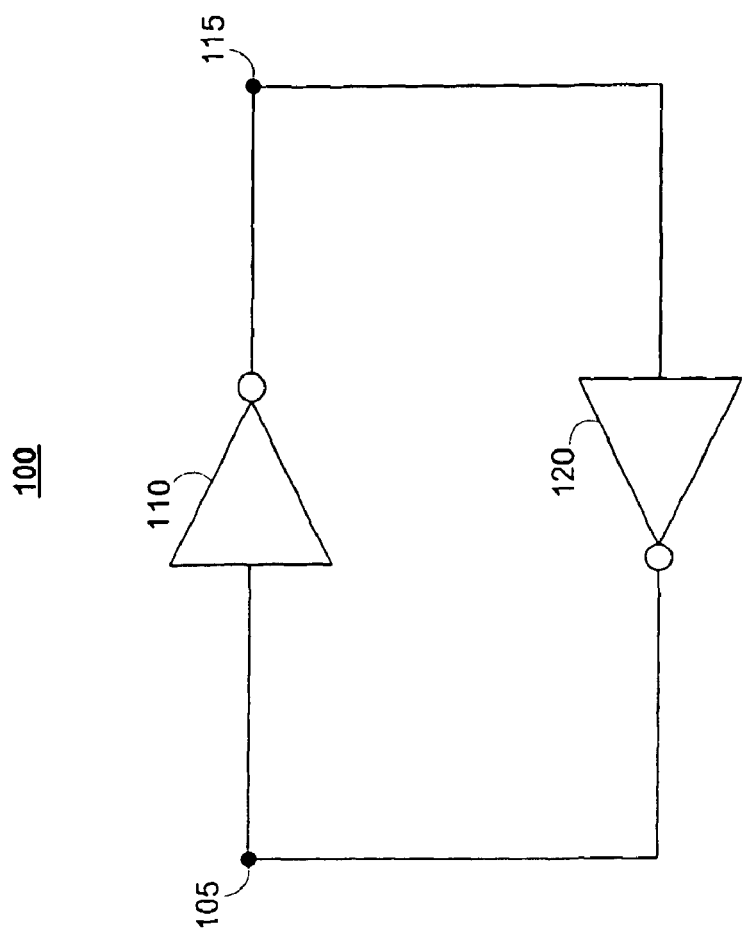
FIG. 1 is a simplified schematic of a typical latch circuit.

FIG. 1 shows a typical latch circuit 100. Latch circuit 100 includes two inverters 110 and 120 connected together in a closed loop. The state of latch circuit 100 may be set by placing a HIGH or LOW voltage state on either node 105 or node 115. The state of the inverter may be set for example, by opening the closed loop with a switch and then setting the open input to a HIGH or LOW voltage state. Once latch circuit is set to a HIGH or LOW voltage state and the loop is closed, the latch will maintain its voltage state until a new voltage state is set.

Figure 2:
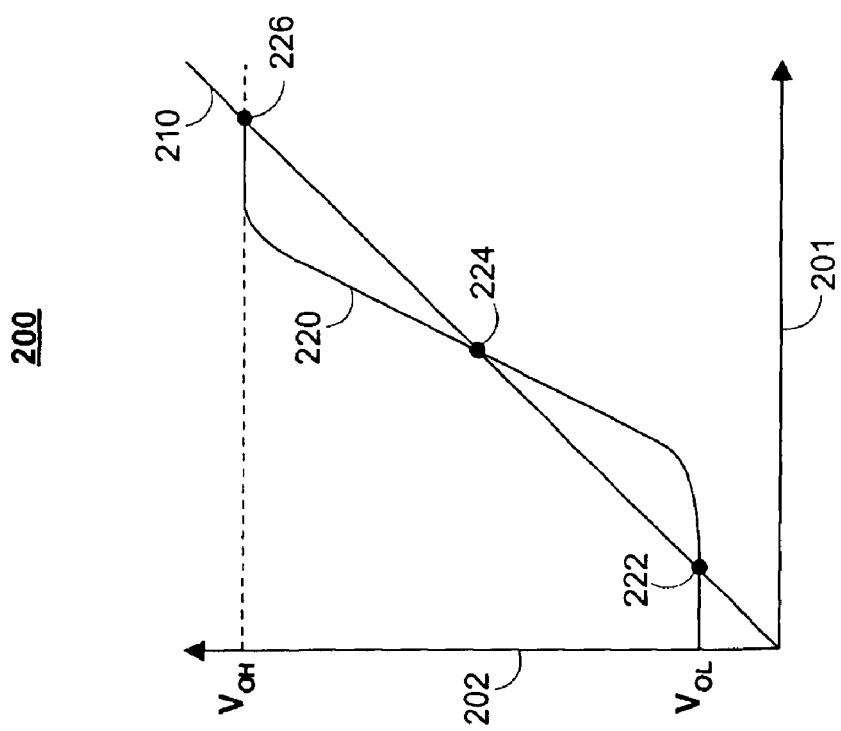
FIG. 2 is a simplified graph of the voltage transfer characteristics of the typical latch circuit.

FIG. 2 shows the voltage transfer characteristics of typical latch circuit 100. Axis 201 is the voltage at the input of inverter 120 and axis 202 is the voltage at the output of inverter 110. The input of inverter 120 is connected to the output inverter 110 at node 115, therefore their respective voltages are equal. Thus, line 210, a straight line with unity slope, represents the relationship between the voltages at node 115. Also shown on the axis is curve 220, which shows the voltage transfer characteristic of the two inverters, assuming the closed loop is broken at node 115. Curve 220 has three regions, a LOW voltage region, a transition region, and a HIGH voltage region. The three points on the graph (222, 224, and 226) where the two lines intersect represent the valid operating points for typical latch circuit 100. Point 222 represents the stable LOW voltage state and point 226 represents the stable HIGH voltage state. Point 224 represents the meta-stable state. While operating at the meta-stable state at point 224, even a small change in the voltage at node 115 will cause the voltage of the node to settle into one of the two stable voltage states.

It is an object of the present invention to minimize the time that the latch circuit remains in the meta-stable state, thus reducing the probability that the meta-stable state is propagated throughout the logic circuit and causes a logic error. In accordance with the invention, the time that the latch circuit remains in the meta-stable state is minimized through the use of a high-gain latch circuit.

One benefit of a high-gain latch circuit may be appreciated by examining FIG. 2. As previously explained, curve 220 represents the voltage transfer characteristics of the latch circuit. Meta-stable operating point 224 is within the transition region of curve 220. The slope of curve 220 in the transition region is related to the gain of the latch circuit. A high-gain latch circuit would have a large slope, while a low-gain latch circuit would have small slope. The larger the slope of curve 220 at meta-stable operating point 224, the more likely the latch circuit will quickly resolve into a stable operating state.

Returning to FIG. 1, the benefit of a high-gain latch circuit may also be seen by examining typical latch circuit 100. When latch circuit 100 is operating in the meta-stable state, if the voltage at node 105 changes by a small increment due to, for example, noise or interference that is inevitably present in any circuit, the voltage at node 115 will also change. If inverter 110 has a greater-than-unity gain, the voltage at node 115 will change by a greater increment than the voltage change at node 105. Thus, this voltage change will loop through the latch circuit, increasing in magnitude according to the gain of the inverters. With a high-gain latch circuit, even a small change in voltage will quickly increase to force the circuit out of the meta-stable state. Merely replacing the inverters of latch circuit 100 with high-gain inverters would reduce the problem of meta-stability, but the resulting latch circuit would be slow, large, and would consume a lot of power.

Further, it is important for the high-gain latch circuit to have at least one node which can provide a fast transition to a stable state. With only two large inverters this fast transition will not occur because both large inverters will load one another. However, by looping four increasingly sized inverters, the largest inverter will drive the smallest inverter creating this fast transition point.

Figure 3:
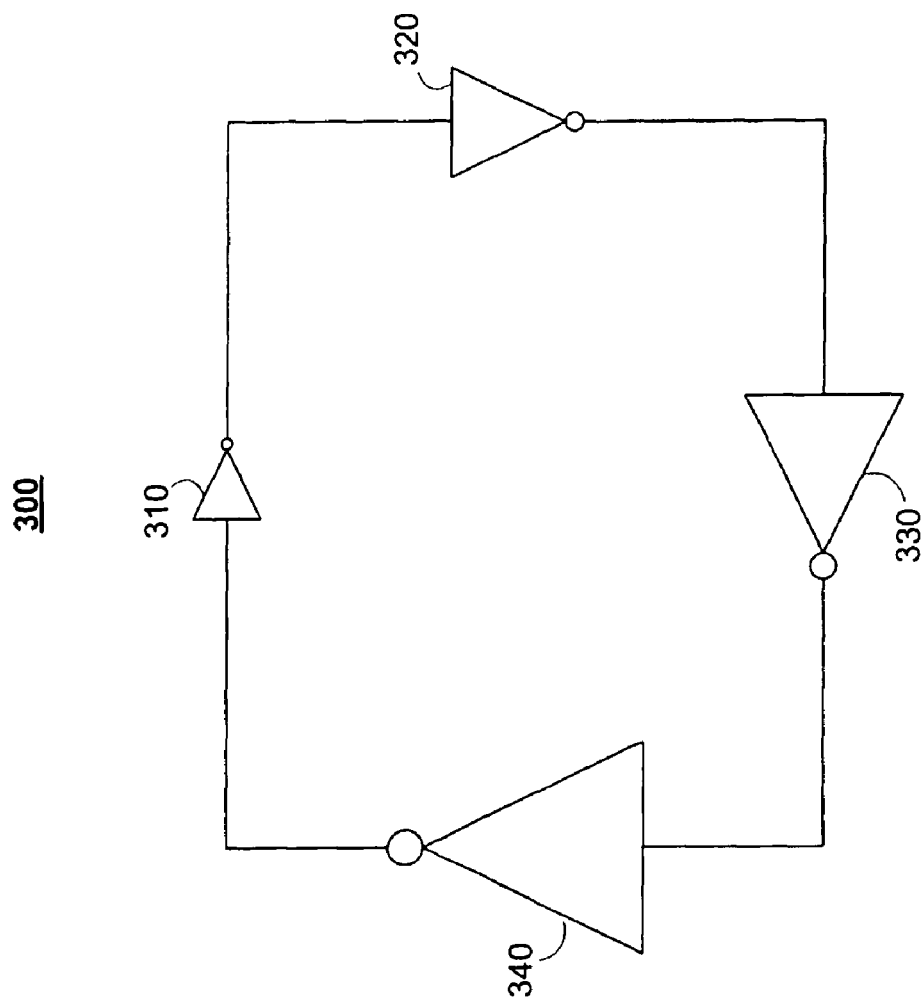
FIG. 3 is a simplified schematic of an illustrative embodiment of a high-gain latch circuit constructed in accordance with the invention.

FIG. 3 shows high-gain latch circuit 300 in accordance with this invention. High-gain latch circuit 300 includes four inverters 310, 320, 330, and 340 connected together in a closed loop circuit. The inverters range in size from the smallest inverter 310 to the largest inverter 340. Inverters 320 and 330 may be larger than the smallest inverter 310 and smaller than the largest inverter 340. For example, inverters 320 and 330 may be sized such that they are approximately evenly distributed, arithmetically or geometrically, between the smallest inverter 310 and the largest inverter 340. Alternatively, only one of inverters 320 and 330 may be sized to be arithmetically or geometrically, between the smallest inverter 310 and the largest inverter 340. Alternatively, inverters 320 and 330 may be sized according to any other arrangement so long as the size of the inverters substantially increases from the smallest inverter 310 to the largest inverter 340. Although it has been calculated that a ratio of the mathematical constant 'e' between two inverters yields the fastest loop response, typically in accordance with the invention at least one of the, or a combination of the two, medium sized inverters is in the range from about two to about four times larger than the smallest inverter, and the largest inverter is in the range from about four to about 16 times larger than the smallest inverter. More preferably, at least one of the, or a combination of the two, medium sized inverters is about three times larger than the smallest inverter, and the largest inverter is about nine times larger than the smallest inverter. These ratios may provide the fastest performance, although other size ratios may be used in accordance with the invention.

High-gain latch circuit 300 typically receives an input signal through one of the smaller inverters such as 320 or 330. The small inverters are fast and can be easily driven by minimally sized logic gates. Medium sized inverters such as 320 or 330 may also be configured to receive the input signal, however use of a larger inverter may adversely affect the speed of the latch circuit. The largest inverter 340 has a high gain and is ideally able to force the high-gain latch circuit to leave a meta-stable state in a minimal time period. The medium inverters 320 and 330 ideally are used to efficiently connect and bridge the difference in size between smallest inverter 310 and largest inverter 340. If smallest inverter 310 were to drive largest inverter 340 directly, it would slow down the operation of the latch circuit. By placing medium inverters 320 and 330 in the latch circuit loop, small inverter 310 only needs to drive slightly larger inverters, which in turn drive the larger inverter 340. High-gain latch circuit 300 is therefore able to significantly reduce the time needed to resolve any potential meta-stability issues, while increasing the overall speed of the latch circuit and reducing size and power consumption.

Figure 4:
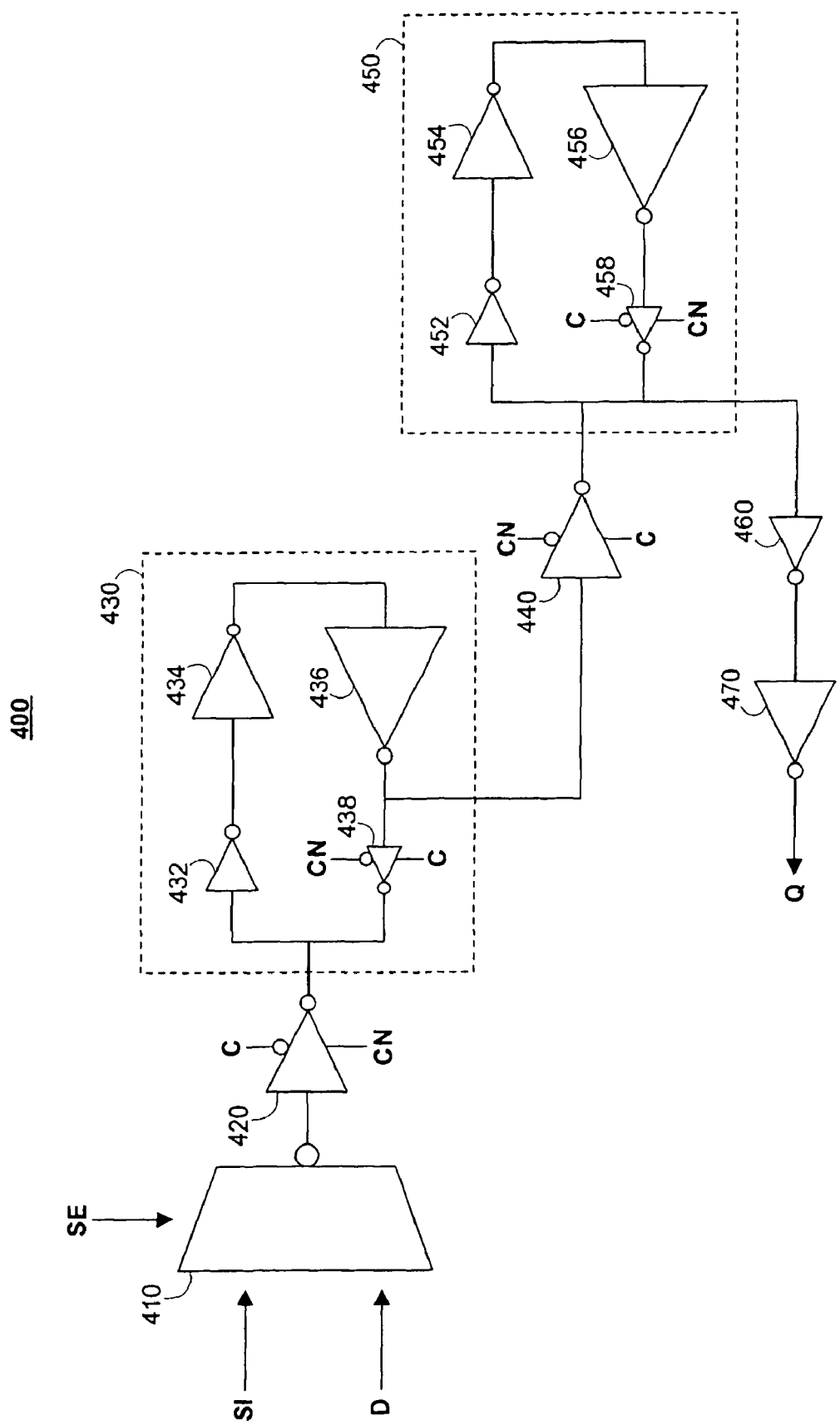
FIG. 4 is a simplified schematic of an illustrative embodiment of a high-gain synchronizer in accordance with the invention.

FIG. 4 shows a high-gain synchronizer circuit 400 in accordance with the invention. High-gain synchronizer circuit includes two high-gain latch circuits 430 and 450 (each constructed in accordance with this invention) in a master-slave configuration as previously described. High-gain synchronizer circuit 400 also includes inverting multiplexer 410, tri-state inverters 420 and 440 and output inverters 460 and 470. High-gain synchronizer circuit 400 receives input D, scan input SI, clock signal C, inverted clock signal CN, and scan enable signal SE. High-gain synchronizer circuit 400 outputs synchronous output signal Q.

Inverting multiplexer 410 multiplexes two inputs D and SI into to synchronizer. D is a standard input signal and SI is a scan input signal, which may be used for diagnostic purposes. Inverting multiplexer 410 is controlled by scan enable input SE. When SE is set HIGH, signal SI is selected; when SE is LOW, signal D is selected.

The inverted output of multiplexer 410 is input to tri-state inverter 420. Inverter 420 is activated at the falling edge of clock signal C. At the falling edge of clock signal C and while clock signal C remains LOW, the output of inverter 420 is loaded into high-gain latch 430. Additionally, while clock signal C is LOW, tri-state inverter 438 within high-gain latch 430 is inactive, thus breaking the closed loop of high-gain latch circuit 430 and permitting small inverter 432 to be loaded with the output of inverter 420.

At the next rising edge of clock signal C, inverter 420 is de-activated and the loop of high-gain latch circuit 430 is closed (tri-state inverter 438 turned on again). While clock C remains HIGH, the input signal received by small inverter 432 is propagated around high-gain latch circuit 430 by passing though medium inverter 434, large inverter 436, tri-state inverter 438, and back again to small inverter 432. In high-gain latch circuit 430 tri-state inverter 438 is preferably minimally sized and is thus the smallest inverter in high-gain latch circuit 430. Thus, in high-gain latch circuit 430 the input signal is received by small inverter 432, but not by the smallest inverter 438. The small size of inverter 438 minimizes the load for large inverter 436, creating the high gain to minimize meta-stability in accordance with the invention. Also, it is very advantageous to locate the input node for a high-gain latch circuit in accordance with this invention between the output terminal of a relatively small tri-state inverter 438 and the input terminal of an also relatively small input inverter 432. The relatively small sizes of these two inverters helps to keep the loading (e.g., the capacitive loading) of the input node relatively low. At the same time, the relatively small size of the input inverter 432 helps to make that inverter more rapidly responsive to the input signal and more rapidly able to begin the process of driving that signal into, through, and around the loop of the latch. These speed advantages may make it possible to increase the operating speed of circuits employing the invention.

While clock signal C remains HIGH, the output of high-gain latch circuit 430 is passed from the output of large inverter 436 to the input of high-gain latch circuit 450 by tri-state inverter 440. The second high-gain latch circuit 450 is used in high-gain synchronizer circuit 400 instead of an ordinary latch circuit to avoid any meta-stability in the second latch and also to increase the overall speed of synchronizer 400. Note that in latch 450 the input node is advantageously again located between the output terminal of relatively small tri-state inverter 458 and the input terminal of relatively small input inverter 452. As in the case of latch 430, this and other features of the circuitry contribute to very high-speed operability of the circuitry. In the case of latch 450 the output node is also the input node, so output inverter 460 is also kept relatively small to reduce load in the input/output node. (In latch 430, for which low input node loading is even more important, the output node of the latch is separated from the input node. Indeed, that output node is the output terminal of largest inverter 436 and disconnected from the input node whenever tri-state inverter 438 is tri-stated.) According to another embodiment of the present invention, high-gain synchronizer circuit 400 may be implemented with only one high-gain latch circuit 430 to save power and space, even though there are benefits to using the second high-gain latch 450.

At the falling edge of clock signal C, the loop of high-gain latch circuit 450 is closed and the output signal Q is latched by the second latch. The output of high-gain latch circuit 450 is propagated through two inverters 460 and 470. Inverter 470 may be a large inverter to provide a strong output signal and inverter 460 may be sized between tri-state inverter 458 and inverter 470.

Thus it is seen that a high-gain synchronizer circuitry and methods are provided. One skilled in the art will appreciate that the invention can be practiced by other than the described embodiments, which are presented for purposes of illustration and not of limitation, and the present invention is limited only by the claims which follow. For example, although the high-gain latches are primarily depicted and described herein as including four inverters connected to one another in a closed-loop series, it will be understood that the closed-loop series can include any even number of inverters having the relative size relationship(s) described herein. Although four inverters are preferred, smaller or larger even numbers of inverters can be used if desired.

The invention claimed is:

1. A method of reducing meta-stable resolve time of a synchronizer circuit comprising:
   receiving an input signal; and
   maintaining said input signal in an inversion chain loop, wherein a subsequent inversion element of said inversion chain loop is larger than a first inversion element of said inversion chain loop, wherein said inversion chain loop consists essentially of an even number of inversion elements.

2. The method of claim 1 wherein said inversion chain loop comprises four inversion elements.

3. The method of claim 1 wherein said subsequent inversion element is larger than said first inversion element by a ratio in the range from about 2 to about 4.

4. The method of claim 1 wherein said inversion chain loop further comprises a further subsequent inversion element, wherein said further subsequent inversion element is larger than said subsequent inversion element.

5. The method of claim 4 wherein said further subsequent inversion element is larger than said subsequent inversion element by a ratio in the range from about 2 to about 4.

6. A method of reducing meta-stable resolve time of a synchronizer circuit comprising:
   receiving an input signal; and
   maintaining said input signal in a first inversion chain loop, wherein a subsequent inversion element of said inversion chain loop is larger than a first inversion element of said inversion chain loop;
   transferring said input signal from said first inversion chain loop to a second inversion chain loop;
   maintaining said input signal in a second inversion chain loop, wherein a subsequent inversion element of said second inversion chain loop is larger than a first inversion element of said second inversion chain loop; and
   outputting said input signal from said second inversion chain loop.

7. The method of claim 6 wherein each of said inversion chain loops comprises four inversion elements.

8. The method of claim 6 wherein each of said inversion chain loops consist essentially of an even number of inversion elements.

9. The method of claim 6 wherein each of said subsequent inversion elements is larger than said first inversion element by a ratio in the range from about 2 to about 4.

10. The method of claim 6 wherein each of said inversion chain loops further comprises a further subsequent inversion element, wherein each of said further subsequent inversion elements is larger than its respective subsequent inversion element.

11. The method of claim 10 wherein each of said further subsequent inversion elements is larger than its respective subsequent inversion element by a ratio in the range from about 2 to about 4.

12. A system for reducing meta-stable resolve time comprising:
   a latch circuit comprising a plurality of serially connected inverter circuits, wherein a last of said plurality of inverter circuits is connected to a first of said plurality of inverter circuits to form a closed loop, wherein an intervening one of said inverter circuits is larger than said first inverter circuit, and wherein said latch circuit consists essentially of an even number of inverter circuits.

13. The system of claim 12 wherein said latch circuit comprises four inverter circuits.

14. The system of claim 12 wherein said intervening inverter circuit is larger than said first inverter circuit by a ratio in the range from about 2 to about 4.

15. The system of claim 12 wherein said latch circuit further comprises a further intervening inverter circuit, wherein said further intervening inverter circuit is larger than said intervening inverter circuit.

16. The system of claim 15 wherein said further intervening inverter circuit is larger than said intervening inverter circuit by a ratio in the range from about 2 to about 4.

17. A method of reducing meta-stable resolve time of a synchronizer circuit comprising:
receiving an input signal at an input node; and
maintaining said input signal with a plurality of inverting elements connected in a closed loop inversion series that extends away from the input node and returns to the input node, the inverting elements increasing in size as one progresses along the series away from the input node for at least a subplurality of the inverting elements, wherein a final one of the inverting elements that returns the series to the input node is smaller than at least one other of the inverting elements in the series.

18. The method of claim 17 further comprising:
controlling the final inverting elements to selectively interrupt the loop.

19. A system for reducing meta-stable resolve time comprising:
a first latch circuit having an input and an output, said first latch circuit comprising a plurality of serially connected inverter circuits, wherein a last of said plurality of inverter circuits is connected to a first of said plurality of inverter circuits to form a closed loop, and wherein an intervening one of said inverter circuits is larger than said first inverter circuit;
a second latch circuit having an input operative to receive said first latch circuit output, and an output, said second latch circuit comprising a plurality of serially connected second inverter circuits, wherein a last of said plurality of second inverter circuits is connected to a first of said plurality of second inverter circuits to form a closed loop, and wherein an intervening one of said second inverter circuits is larger than said first of said second inverter circuits.

20. The system of claim 19 wherein each of said latch circuits comprises four inverter circuits.

21. The system of claim 19 wherein each of said latch circuits consist essentially of an even number of inverter circuits.

22. The system of claim 19 wherein each of said intervening inverter circuits is larger than its respective first inverter circuit by a ratio in the range from about 2 to about 4.

23. The system of claim 19 wherein each of said latch circuits further comprises a further intervening inverter circuit, wherein each of said further intervening inverter circuits is larger than its respective intervening inverter circuit.

24. The system of claim 23 wherein each of said further intervening inverter circuits is larger than its respective intervening inverter circuit by a ratio in the range from about 2 to about 4.

25. A system for reducing meta-stable resolve time comprising:
means for latching comprising a plurality of serially connected means for inverting, wherein a last of said plurality of means for inverting is connected to a first of said plurality of means for inverting to form a closed loop, wherein an intervening one of said means for inverting is larger than said first means for inverting, and wherein said means for latching consists essentially of an even number of means for inverting.

26. The system of claim 25 wherein said means for latching comprises four means for inverting.

27. The system of claim 25 wherein said intervening means for inverting is larger than said first means for inverting by a ratio in the range from about 2 to about 4.

28. The system of claim 25 wherein said means for latching further comprises a further intervening means for inverting, wherein said further intervening means for inverting is larger than said intervening means for inverting.

29. The system of claim 28 wherein said further intervening means for inverting is larger than said intervening means for inverting by a ratio in the range from about 2 to about 4.

30. A system for reducing meta-stable resolve time comprising:
a first means for latching having an input means and an output means, said first means for latching comprising a plurality of serially connected means for inverting, wherein a last of said plurality of means for inverting is connected to a first of said plurality of means for inverting to form a closed loop, and wherein an intervening one of said means for inverting is larger than said first means for inverting;
a second means for latching having an input means operative to receive said first means for latching output means, and an output means, said second means for latching comprising a plurality of serially connected second means for inverting, wherein a last of said plurality of second means for inverting is connected to a first of said plurality of second means for inverting to form a closed loop, and wherein an intervening one of said second means for inverting is larger than said first of said second means for inverting.

31. The system of claim 30 wherein each of said means for latching comprises four means for inverting.

32. The system of claim 30 wherein each of said means for latching consists essentially of an even number of means for inverting.

33. The system of claim 30 wherein each of said intervening means for inverting is larger than its respective first means for inverting by a ratio in the range from about 2 to about 4.

34. The system of claim 30 wherein each of said means for latching further comprises a further intervening means for inverting, wherein each of said further intervening means for inverting is larger than its respective intervening means for inverting.

35. The system of claim 34 wherein each of said further intervening means for inverting is larger than its respective intervening means for inverting by a ratio in the range from about 2 to about 4.

36. A method of reducing meta-stable resolve time of a synchronizer circuit comprising:
receiving an input signal at an input node; and
maintaining said input signal with a plurality of inverting elements connected in a closed loop inversion series that extends away from the input node and returns to the input node, the inverting elements increasing in size as one progresses along the series away from the input node for at least a subplurality of the inverting elements, wherein the plurality of inverting elements consists essentially of an even number of the inverting elements.

37. The method of claim 36 wherein the plurality of inverting elements comprises four of the inverting elements.

38. The method of claim 36 wherein the subplurality of the inverting elements comprises three of the inverting elements.

39. The method of claim 36 further comprising an output node connected in series between two of the inverting elements.

40. The method of claim 39 wherein at least one of the inverting elements is connected in series between the output node and the input node.

41. The method of claim 40 wherein the output node is connected to an input terminal of a final one of the inverting elements that returns the series to the input node via an output terminal of that final inverting elements.

42. The method of claim 39 wherein the output node is connected to the input node without any of the inverting elements intervening.

43. The method of claim 41 further comprising:
connecting slave latch circuitry to the output node.

44. The method of claim 43 further comprising:
selectively applying a further signal from the output node to further circuitry of the slave latch circuitry via a second input node of the further circuitry.

45. The method of claim 44 further comprising:
maintaining the further signal with a second plurality of second inverting elements connected in a second closed loop series that extends away from the second input node and returns to the second input node, the second inverting elements increasing in size as one progresses away from the second input node for at least a second subplurality of the second inverting elements.

46. The method of claim 45 wherein a final one of the second inverting elements that returns the second series to the second input node is smaller than at least one other one of the second inverting elements.

47. The method of claim 46 wherein the final one of the second inverting elements is controllable to selectively interrupt the second loop.

48. The method of claim 47 wherein the further circuitry further comprises a second output node connected to the second input node without any of the second inverting elements intervening.

49. The method of claim 36 further comprising:
increasing the size of the subplurality of the inverting elements in an approximately arithmetic series.

50. The method of claim 36 further comprising:
increasing the size of the subplurality of the inverting elements in an approximately geometric series.

51. The method of claim 50 wherein the geometric series has a ratio in the range from about 2 to about 4.

52. The method of claim 50 wherein the geometric series has a ratio of approximately 3.

53. A method of reducing meta-stable resolve time of a synchronizer circuit comprising:
receiving an input signal at an input node;
maintaining said input signal with a plurality of inverting elements connected in a closed loop inversion series that extends away from the input node and returns to the input node, the inverting elements increasing in size as one progresses along the series away from the input node for at least a subplurality of the inverting elements; and
selectively applying an input signal to the input node with input gate circuitry.

54. The method of claim 53 further comprising:
controlling one of the inverting elements to selectively interrupt the series.

55. The method of claim 54 further comprising:
synchronously controlling the input gate circuitry and the controllable one of the inverting elements.

56. Latch circuitry comprising:
an input node; and
a plurality of inverter circuits connected in a closed loop series that extends away from the input node and returns to the input node, the inverter circuits increasing in size as one progresses along the series away from the input node for at least a subplurality of the inverter circuits, wherein the plurality of inverter circuits consists essentially of an even number of the inverter circuits.

57. The circuitry defined in claim 56 wherein the plurality of inverter circuits comprises four of the inverter circuits.

58. The circuitry defined in claim 56 wherein the subplurality of the inverter circuits comprises three of the inverter circuits.

59. The circuitry defined in claim 56 further comprising an output node connected in series between two of the inverter circuits.

60. The circuitry defined in claim 59 wherein at least one of the inverter circuits is connected in series between the output node and the input node.

61. The circuitry defined in claim 60 wherein the output node is connected to an input terminal of a final one of the inverter circuits that returns the series to the input node via an output terminal of that final inverter circuit.

62. The circuitry defined in claim 59 wherein the output node is connected to the input node without any of the inverter circuits intervening.

63. The circuitry defined in claim 61 further comprising:
slave latch circuitry connected to the output node.

64. The circuitry defined in claim 63 wherein the slave latch circuitry comprises:
input gate circuitry that selectively applies a signal from the output node to further circuitry of the slave latch circuitry.

65. The circuitry defined in claim 64 wherein the further circuitry comprises:
a second input node that receives a signal from the input gate circuitry; and
a second plurality of second inverter circuits connected in a second closed loop series that extends away from the second input node and returns to the second input node, the second inverter circuits increasing in size as one progresses away from the second input node for at least a second subplurality of the second inverter circuits.

66. The circuitry defined in claim 65 wherein a final one of the second inverter circuits that returns the second series to the second input node is smaller than at least one other one of the second inverter circuits.

67. The circuitry defined in claim 66 wherein the final one of the second inverter circuits is controllable to selectively interrupt the second loop.

68. The circuitry defined in claim 67 wherein the further circuitry further comprises a second output node connected to the second input node without any of the second inverter circuits intervening.

69. The circuitry defined in claim 56 wherein the subplurality of the inverter circuits increase in size in an approximately arithmetic series.

70. The circuitry defined in claim 56 wherein the subplurality of the inverter circuits increase in size in an approximately geometric series.

71. The circuitry defined in claim 70 wherein the geometric series has a ratio in the range from about 2 to about 4.

72. The circuitry defined in claim 70 wherein the geometric series has a ratio of approximately 3.

73. Latch circuitry comprising:
an input node; and
a plurality of inverter circuits connected in a closed loop series that extends away from the input node and returns to the input node, the inverter circuits increasing in size as one progresses along the series away from the input node for at least a subplurality of the inverter circuits, wherein a final one of the inverter circuits that returns the series to the input node is smaller than at least one other of the inverter circuits in the series.

74. The circuitry defined in claim 73 wherein the final inverter circuit is controllable to selectively interrupt the loop.

75. Latch circuitry comprising:
an input node;
a plurality of inverter circuits connected in a closed loop series that extends away from the input node and returns to the input node, the inverter circuits increasing in size as one progresses along the series away from the input node for at least a subplurality of the inverter circuits; and
input gate circuitry that selectively applies an input signal to the input node.

76. The circuitry defined in claim 75 wherein one of the inverter circuits is controllable to selectively interrupt the series.

77. The circuitry defined in claim 76 wherein the input gate circuitry and the controllable one of the inverter circuits are synchronously controllable.

78. Latch circuitry comprising:
an input means; and
a plurality of means for inverting connected in a closed loop series that extends away from the input means and returns to the input means, the means for inverting increasing in size as one progresses along the series away from the input means for at least a subplurality of the means for inverting, wherein the plurality of means for inverting consists essentially of an even number of the means for inverting.

79. The circuitry defined in claim 78 wherein the plurality of means for inverting comprises four of the means for inverting.

80. The circuitry defined in claim 78 wherein the subplurality of the means for inverting comprises three of the means for inverting.

81. The circuitry defined in claim 78 further comprising an output means connected in series between two of the means for inverting.

82. The circuitry defined in claim 81 wherein at least one of the means for inverting is connected in series between the output means and the input means.

83. The circuitry defined in claim 82 wherein the output means is connected to an input terminal of a final one of the means for inverting that returns the series to the input means via an output terminal of that final means for inverting.

84. The circuitry defined in claim 81 wherein the output means is connected to the input means without any of the means for inverting intervening.

85. The circuitry defined in claim 78 wherein the subplurality of the means for inverting increase in size in an approximately arithmetic series.

86. The circuitry defined in claim 78 wherein the subplurality of the means for inverting increase in size in an approximately geometric series.

87. The circuitry defined in claim 86 wherein the geometric series has a ratio in the range from about 2 to about 4.

88. The circuitry defined in claim 86 wherein the geometric series has a ratio of approximately 3.

89. The circuitry defined in claim 83 further comprising:
slave means for latching connected to the output means.

90. The circuitry defined in claim 89 wherein the slave means for latching comprises:
input gate means that selectively applies a signal from the output means to further means of the slave means for latching.

91. The circuitry defined in claim 90 wherein the further means comprises:
a second input means that receives a signal from the input gate means; and
a second plurality of second means for inverting connected in a second closed loop series that extends away from the second input means and returns to the second input means, the second means for inverting increasing in size as one progresses away from the second input node for at least a second subplurality of the second means for inverting.

92. The circuitry defined in claim 91 wherein a final one of the second means for inverting that returns the second series to the second input means is smaller than at least one other one of the second means for inverting.

93. The circuitry defined in claim 92 wherein the final one of the second means for inverting is controllable to selectively interrupt the second loop.

94. The circuitry defined in claim 93 wherein the further means further comprises a second output means connected to the second input means without any of the second means for inverting intervening.

95. Latch circuitry comprising:
an input means; and
a plurality of means for inverting connected in a closed loop series that extends away from the input means and returns to the input means, the means for inverting increasing in size as one progresses along the series away from the input means for at least a subplurality of the means for inverting, wherein a final one of the means for inverting that returns the series to the input means is smaller than at least one other of the means for inverting in the series.

96. The circuitry defined in claim 95 wherein the final means for inverting is controllable to selectively interrupt the loop.

97. Latch circuitry comprising:
an input means;
a plurality of means for inverting connected in a closed loop series that extends away from the input means and returns to the input means, the means for inverting increasing in size as one progresses along the series away from the input means for at least a subplurality of the means for inverting; and
input gate means that selectively applies an input signal to the input mean.

98. The circuitry defined in claim 97 wherein one of the means for inverting is controllable to selectively interrupt the series.

99. The circuitry defined in claim 98 wherein the input gate means and the controllable one of the means for inverting are synchronously controllable.

* * * * *